(12) United States Patent
Watanabe et al.

(10) Patent No.: US 7,469,196 B2
(45) Date of Patent: Dec. 23, 2008

(54) MEASURING A CHARACTERISTIC OF A TRANSFER CIRCUIT

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 208 days.

(21) Appl. No.: 11/300,684

(22) Filed: Dec. 14, 2005

(65) Prior Publication Data

US 2007/0131848 A1    Jun. 14, 2007

(51) Int. Cl.
G06F 15/00 (2006.01)
G01D 1/00 (2006.01)
G06M 11/04 (2006.01)

(52) U.S. Cl. .................. 702/127; 356/218; 356/943

(58) Field of Classification Search .......... 702/127, 702/176, 189, 193; 356/218, 229, 943; 385/14, 385/122, 147; 398/115, 128, 130, 133, 135, 398/138, 140, 164; 330/59
See application file for complete search history.

(56) References Cited

U.S. PATENT DOCUMENTS

| | | | | |
|---|---|---|---|---|
| 4,812,910 | A * | 3/1989 | Komiya | 358/464 |
| 6,101,122 | A * | 8/2000 | Hirota | 365/185.05 |
| 6,496,288 | B2 * | 12/2002 | Yamane et al. | 398/23 |
| 6,501,288 | B1 * | 12/2002 | Wilsher | 324/753 |
| 6,782,202 | B2 * | 8/2004 | Arita et al. | 398/60 |
| 6,911,851 | B2 * | 6/2005 | Sekiguchi et al. | 327/141 |
| 2003/0161637 | A1 * | 8/2003 | Yamamoto et al. | 398/167.5 |
| 2005/0270412 | A1 * | 12/2005 | Kamon et al. | 348/362 |

FOREIGN PATENT DOCUMENTS

| | | |
|---|---|---|
| JP | 2-137550 | 5/1990 |
| JP | 6-120898 | 4/1994 |
| JP | 2000-155349 | 6/2000 |
| WO | WO-2004/095736 | 11/2004 |

OTHER PUBLICATIONS

Karabegov et al., 'Calculation of Functional Characteristics of Optical Compensators in Photometeric Analyzers', Oct. 1966, UDC Publication, pp. 1333-1337.*
Kobayashi et al.,'Automatic Frequency Control in Semiconductor Laser and Optical Amplifier', Jun. 1983, IEEE Publication, vol. 1, No. 2, pp. 394-402.*
Patent Abstracts of Japan, Publication No. 2000-155349, Publication Date: Jun. 6, 2000, 2 pages.
Japanese PCT Search Report for PCT /JP2006/324817 dated Jan. 23, 2007, and English translation thereof, 10 pages.

* cited by examiner

*Primary Examiner*—Edward Raymond
*Assistant Examiner*—Elias Desta
(74) *Attorney, Agent, or Firm*—Osha • Liang LLP

(57) ABSTRACT

A measuring apparatus that measures a characteristic of a transfer circuit includes: an electrical signal sending section that transmits a sending signal; a current to light converting section that converts the sending signal into an optical signal; an optical signal transmitting section that transmits the optical signal; a photo-electric converting circuit tat converts the optical signal into an electrical signal; a level measuring section that compares the intensity of the electrical signal output from said photo-electric converting circuit and a predetermined reference level to detect a data value of the electrical signal; an electrical signal receiving section that detects a data value of the electrical signal; and a timing controlling section that controls latch timing at which said electrical signal receiving section detects the data value of the electrical signal.

7 Claims, 6 Drawing Sheets

MEASURING A CHARACTERISTIC OF A TRANSFER CIRCUIT

BACKGROUND OF THE INVENTION

1. Field of the Invention

The present invention relates to a measuring apparatus and a measuring method for measuring a characteristic of a transfer circuit including an optical transmission system, and a transfer circuit that can measure a characteristic easily.

2. Description of Related Art

Conventionally, a transfer circuit including an optical transmission system is known as a transmission system of a signal from a transmitting side device to a receiving side device. For example, the transfer circuit includes a system for transmitting an electrical signal, a system for converting an electric signal into an optical signal, a system for transmitting an optical signal, and a system for converting an optical signal into an electrical signal.

According to a conventional measuring method, in order to diagnose whether the transfer circuit can transmit data rightly, the transfer circuit is diagnosed by generating known pattern data from the transmitting side device and comparing the known pattern data with pattern data received by the receiving side device.

In addition, it is important as a characteristic of a transfer circuit whether a signal transmitted by the transfer circuit can rightly receive by the receiving side device by having a timing margin to some degree. However, the transfer circuit including an optical transmission system has the variation of characteristics of a device such as a light-emitting element and a photo detector and the variation of transmission characteristics by contamination of a plane of light emission and a plane of light incidence.

For this reason, it is preferable to perform detailed measurement including a light receiving characteristic or the like in an optical transmission system. However, it was difficult to perform detailed measurement in a conventional manner.

Therefore, it is an object of the present invention to provide a measuring apparatus, a transfer circuit, and a measuring method that can solve the foregoing problems. The above and other objects can be achieved by combinations described in the independent claims. The dependent claims define further advantageous and exemplary combinations of the present invention.

SUMMARY OF THE INVENTION

To solve this problem, according to the first aspect of the present invention, there is provided a measuring apparatus that measures a characteristic of a transfer circuit transmitting a signal. The transfer circuit includes: an electrical signal sending section that transmits a sending signal; a current to light converting section that converts the sending signal into an optical signal; an optical signal transmitting section that transmits the optical signal; a photo-electric converting circuit that converts the optical signal into an electrical signal; a level measuring section that compares the intensity of the electrical signal output from the photo-electric converting circuit and a predetermined reference level to detect a data value of the electrical signal; an electrical signal receiving section that detects a data value of the electrical signal; and a timing controlling section that controls latch timing at which the electrical signal receiving section detects the data value of the electrical signal. The measuring apparatus includes: a comparing section that compares the data value of the electrical signal received by the electrical signal receiving section with a predetermined expected value; a setting controlling section that sequentially changes the reference level and the latch timing; and a result storing section that stores a comparison result by the comparing section for each the reference level and the latch timing.

The setting controlling section may sequentially change the latch timing in a predetermined timing variation region whenever the reference level is changed.

The setting controlling section may sequentially change the reference level in a predetermined level variation region whenever the latch timing is changed.

The measuring apparatus may further include a transmission system measuring section that measures a timing margin of the transfer circuit based on the comparison result for each the reference level and the latch timing.

The transmission system measuring section may compute the latch timing to be set in real use of the transfer circuit based on the timing margin.

The measuring apparatus may include: an initial setting signal controlling section that sequentially sends the sending signal showing H level and the sending signal showing L level to the electrical signal sending section previously; an initial setting information detecting section that sequentially changes the reference level and previously detects the reference level at which the data value of the electrical signal measured by the level measuring section is switched for each of the sending signal of H level and the sending signal of L level when the electrical signal sending section has sent the sending signals of H level and L level; and an initial setting computing section that previously computes the level variation region based on each the reference level detected by the initial setting information detecting section.

According to the second aspect of the present invention, there is provided a transfer circuit that transmits a signal. The transfer circuit includes: an electrical signal sending section that sends a sending signal; a current to light converting section that converts the sending signal to an optical signal; an optical signal transmitting section that transmits the optical signal; a photo-electric converting circuit that converts the optical signal to an electrical signal; and an electrical signal receiving section that detects a data value of the electrical signal, in which the photo-electric converting circuit includes: a level measuring section that compares the intensity of the electrical signal and a predetermined reference level to detect a data value of the electrical signal; and a measurement controlling section that controls the reference level, and the electrical signal receiving section includes: a receiving circuit that detects a data value of the electrical signal; and a timing controlling section that controls latch timing at which the receiving circuit detects the data value.

The measurement controlling section may control the reference level according to a level setting signal given from an apparatus connected to the transfer circuit, and the timing controlling section may control the latch timing according to a timing setting signal given from an apparatus connected to the transfer circuit.

The electrical signal receiving section may further include a comparing section that compares the data value of the electrical signal received by the receiving circuit with a predetermined expected value.

The comparing section may output a comparison result to the apparatus connected to the transfer circuit.

The electrical signal receiving section may further include an expectation generating section that generates the expected value having a pattern generally same as the sending signal.

According to the third aspect of the present invention, there is provided a method for measuring a characteristic of a transfer circuit transmitting a signal. The transfer circuit includes: an electrical signal sending section that transmits a sending signal; a current to light converting section that converts the sending signal to an optical signal; an optical signal transmitting section that transmits the optical signal; a photo-electric converting circuit that converts the optical signal to an electrical signal; a level measuring section that compares the intensity of the electrical signal output from the photo-electric converting circuit and a predetermined reference level to detect a data value of the electrical signal; an electrical signal receiving section that detects a data value of the electrical signal; and a timing controlling section that controls latch timing at which the electrical signal receiving section detects the data value of the electrical signal. The measurement method includes: a comparing step of comparing the data value of the electrical signal received by the electrical signal receiving section with a predetermined expected value; a setting controlling step of sequentially changing the reference level and the latch timing; and a result storing step of storing a comparison result in the comparing step for each the reference level and the latch timing.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
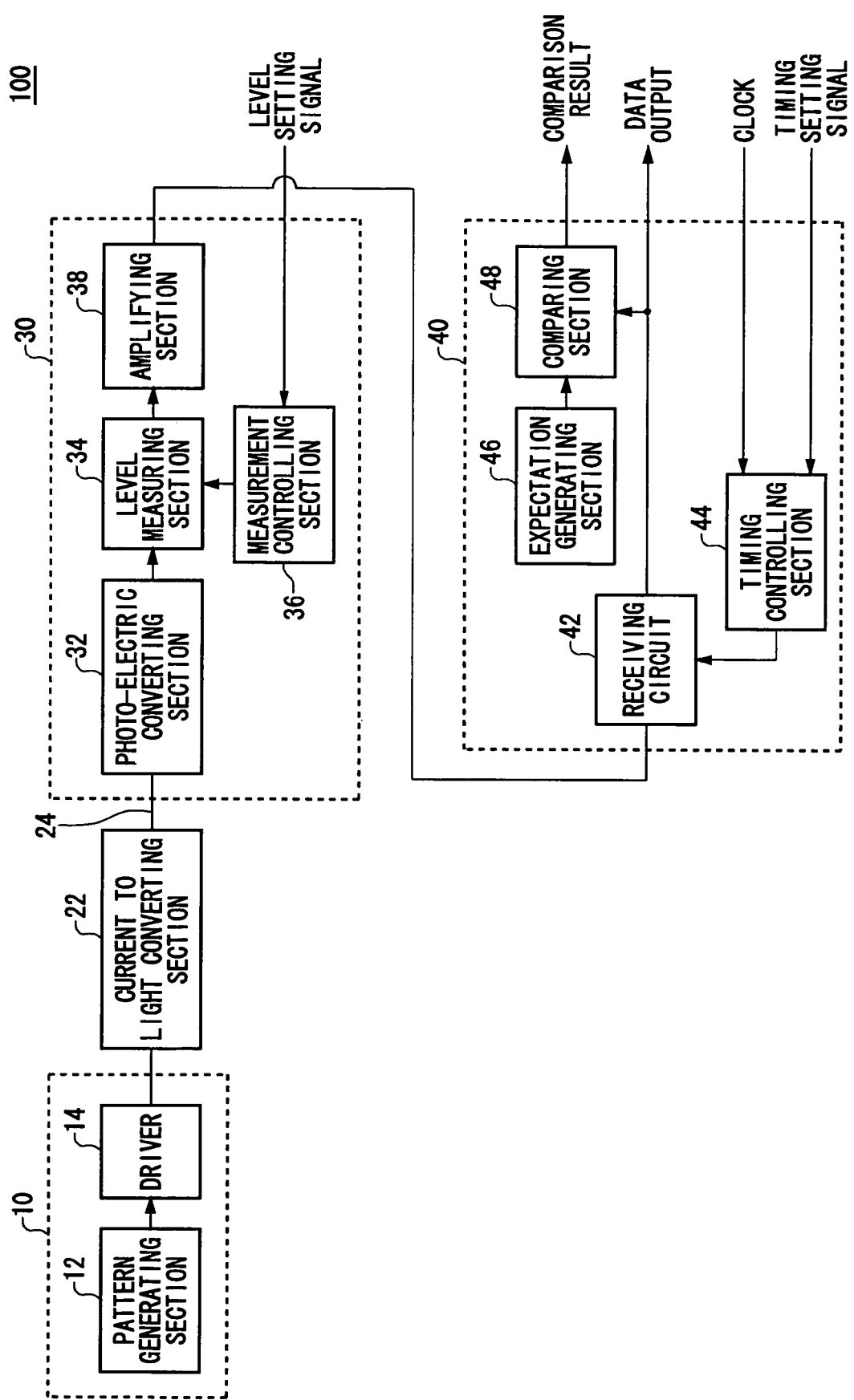
FIG. 1 is a view exemplary showing a configuration of a transfer circuit according to an embodiment of the present invention.

FIG. 1 is a view exemplary showing a configuration of a transfer circuit 100 according to an embodiment of the present invention. The transfer circuit 100 includes an electrical signal sending section 10, a current to light converting section 22, an optical signal transmitting section 24, a photo-electric converting circuit 30, and an electrical signal receiving section 40. The transfer circuit 100 may be a circuit that transmits a signal between a transmission device and a reception device. Moreover, the transfer circuit 100 may be a system including a part of a transmission device and a reception device. For example, the electrical signal sending section 10 maybe be provided in a transmission device, and the photo-electric converting circuit 30 and the electrical signal receiving section 40 may be provided in a reception device.

In this example, the electrical signal sending section 10 has a pattern generating section 12 and a driver 14. The pattern generating section 12 generates a signal pattern of an electrical signal to be transmitted. For example, the pattern generating section 12 may be an algorithm pattern generating apparatus that generates the signal pattern based on a previously given program, or may be a pseudo random pattern generating apparatus that generates a pseudo random pattern as a signal pattern.

The driver 14 generates an electrical signal based on a signal pattern supplied from the pattern generating section 12, and outputs the generated signal to the current to light converting section 22 as a sending signal.

The optical signal transmitting section 24 is an optical signal transmission medium, and for example may be an optical fiber or a light guide. The current to light converting section 22 converts the sending signal output from the electrical signal sending section 10 into an optical signal. The current to light converting section 22 is, e.g., a laser diode emitting light according to a sending signal. Moreover, the optical signal transmitting section 24 transmits the optical signal output from the current to light converting section 22 to the photo-electric converting circuit 30.

The photo-electric converting circuit 30 has a photo-electric converting section 32, a level measuring section 34, a measurement controlling section 36, and an amplifying section 38. The photo-electric converting section 32 receives the optical signal transmitted from the optical signal transmitting section 24 and converts the optical signal into an electrical signal. For example, the photo-electric converting section 32 is a photo diode that generates an electric current according to the received optical signal.

The level measuring section 34 detects a data value of an electrical signal by comparing the magnitude of the electrical signal output from the photo-electric converting section 32 and a predetermined reference level. For example, the level measuring section 34 outputs H level as a data value of the electrical signal when the magnitude of the electrical signal is larger than the reference level, and outputs L level as a data value of the electrical signal when the intensity of the electrical signal is less than the reference level.

The measurement controlling section 36 controls the reference level used in the level measuring section 34. For example, the measurement controlling section 36 is a digital to analog converter, and supplies a reference level according to a given level setting signal to the level measuring section 34.

The amplifying section 38 amplifies the signal level output from the level measuring section 34 to a predetermined signal level.

The electrical signal receiving section 40 receives the electrical signal output from the photo-electric converting section 30. In this example, the electrical signal receiving section 40 has a receiving circuit 42, a timing controlling section 44, an expectation generating section 46, and a comparing section 48. The receiving circuit 42 receives the signal output from the amplifying section 38. In this example, the receiving circuit 42 detects a data value of the electrical signal output from the amplifying section 38 at a given latch timing.

The timing controlling section 44 controls the latch timing at which the receiving circuit 42 detects the data value of the electrical signal. For example, the timing controlling section 44 delays a clock signal with a predetermined period according to a given timing setting signal, in order to supply the delayed signal to the receiving circuit 42. The receiving circuit 42 sequentially detects a data value of an electrical signal according to an edge of a signal given from the timing controlling section 44.

The comparing section 48 compares the data value of the electrical signal detected by the receiving circuit 42 with a predetermined expected value. The expectation generating section 46 generates the expected value, and supplies it to the comparing section 48. The expectation generating section 46 may generate an expected value having a pattern identical with the signal pattern output from the pattern generating section 12.

In this example, the comparing section 48 and the expectation generating section 46 are provided in the transfer circuit 100. However, in another example, an outside measuring apparatus may have the comparing section 48 and the expectation generating section 46.

Figure 2:
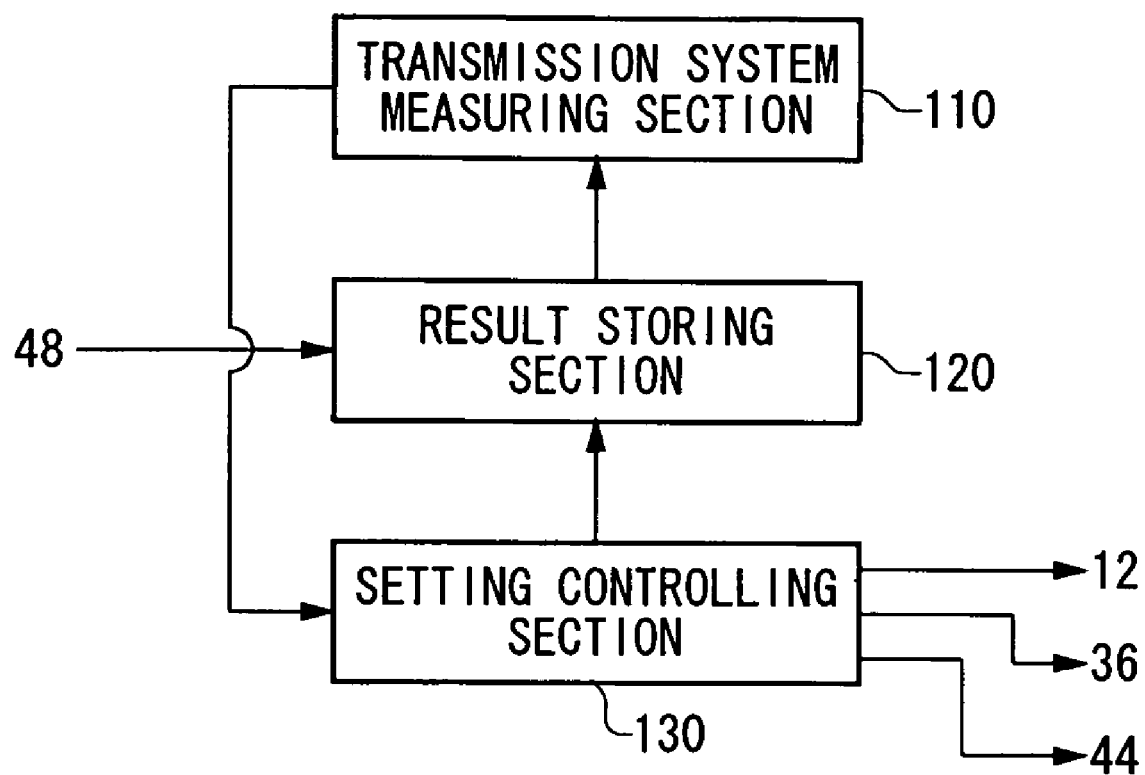
FIG. 2 is a view exemplary showing a configuration of a measuring apparatus that measures a characteristic of the transfer circuit.

FIG. 2 is a view exemplary showing a configuration of the measuring apparatus 200 that measures a characteristic of the transfer circuit 100. The measuring apparatus 200 has a transmission system measuring section 110, a result storing section 120, and a setting controlling section 130. The measuring apparatus 200 in this example sequentially changes the reference level supplied to the level measuring section 34 and the latch timing supplied to the receiving circuit 42 in a predetermined level variation region and timing variation region, for the transfer circuit 100 including an optical transmission system, and acquires a comparison result by the comparing section 48 every combination of the reference level and the latch timing. The measuring apparatus 200 measures a characteristic of the transfer circuit 100 based on the comparison result.

Figure 3:
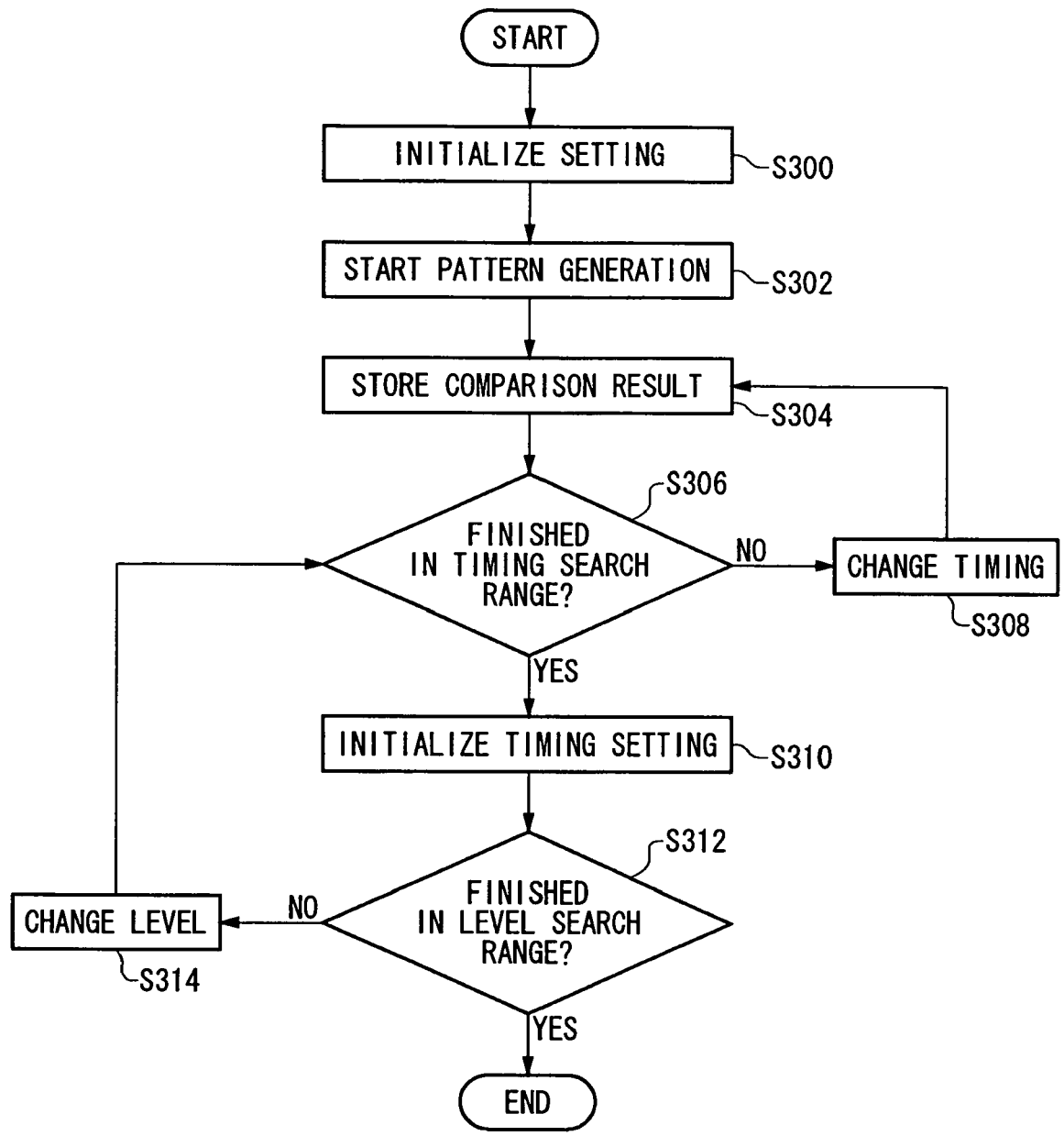
FIG. 3 is a view exemplary showing an operation of the measuring apparatus shown in FIG. 2.

FIG. 3 is a view exemplary showing an operation of the measuring apparatus 200 shown in FIG. 2. At first, in an initial setting step S300, the setting controlling section 130 initializes the transfer circuit 100. For example, the setting controlling section 130 outputs a level setting signal and a timing setting signal by which the reference level and the latch timing output from the measurement controlling section 36 and the timing controlling section 44 are set to an initial value.

Next, in a pattern generating step S302, the setting controlling section 130 makes the pattern generating section 12 generate a predetermined pattern signal. As described above, the pattern signal may be a pseudo random pattern signal. Moreover, in the example described above, the transfer circuit 100 has the pattern generating section 12 and the driver 14. However, in another example, the measuring apparatus 200 may have the pattern generating section 12 and the driver 14. In this case, the measuring apparatus 200 generates a sending signal, and inputs it to the transfer circuit 100.

Next, in a comparison result storing step S304, the result storing section 120 stores a comparison result by the comparing section 48. In the comparison result storing step S304, the comparing section 48 may output a comparison result every predetermined test period. For example, the test period may be a period including a predetermined cycle number of the sending signal output from the electrical signal sending section 10. In this case, when each data value of the electrical signal detected by the receiving circuit 42 is entirely identical with each data value of the expectation pattern output from the expectation generating section 46 for the predetermined cycle number, the comparing section 48 outputs a pass as the comparison result in the test period. Moreover, when some data are not identical with each other, the comparing section outputs a fail as the comparison result in the test period.

Next, in a first judgment step S306, the setting controlling section 130 decides whether all the latch timings to be set have been set, in regard to the set reference level. For example, the setting controlling section 130 decides whether the latch timing has been changed with a predetermined resolution, over the whole timing variation region. In the first judgment step S306, when there exists the latch timing not yet set, the setting controlling section 130 sets the next latch timing (a timing modifying step S308). Then, until the comparison results are stored for all latch timings, the processes from S304 to S306 are repeated. At this time, the pattern generating section 12 may generate the same pattern signal for each of the latch timings.

Moreover, in the first judgment step S306, when it is decided that the settings of all latch timings have been finished, the setting controlling section 130 supplies a timing setting signal initializing the timing controlling section 44 (a timing setting initializing step S310).

Next, in a second judgment step S312, the setting controlling section 130 controls whether all reference levels to be set have been set. For example, the setting controlling section 130 decides whether the reference level has been changed with a predetermined resolution, over the whole level variation region.

In the second judgment step S312, when it is decided that all reference levels have been set, the measuring apparatus finishes storing the comparison result. Moreover, in the second judgment step S312, when it is decided that there exists the reference level not set, the setting controlling section 130 sets the next reference level (a level modifying step S314). Then, the measuring apparatus 200 repeats the processes from S306 to S314.

By such a process, the comparison results can be stored with respect to all combinations of the reference levels and the latch timings to be set. The result storing section 120 stores each comparison result in association with a combination of the reference level and the latch timing.

Moreover, in this example, the setting controlling section 130 sequentially changes the latch timing in a predetermined timing variation region whenever the reference level is changed. However, in another example, the setting controlling section 130 may change the reference level in a predetermined level variation region whenever the latch timing is changed.

Figure 4:
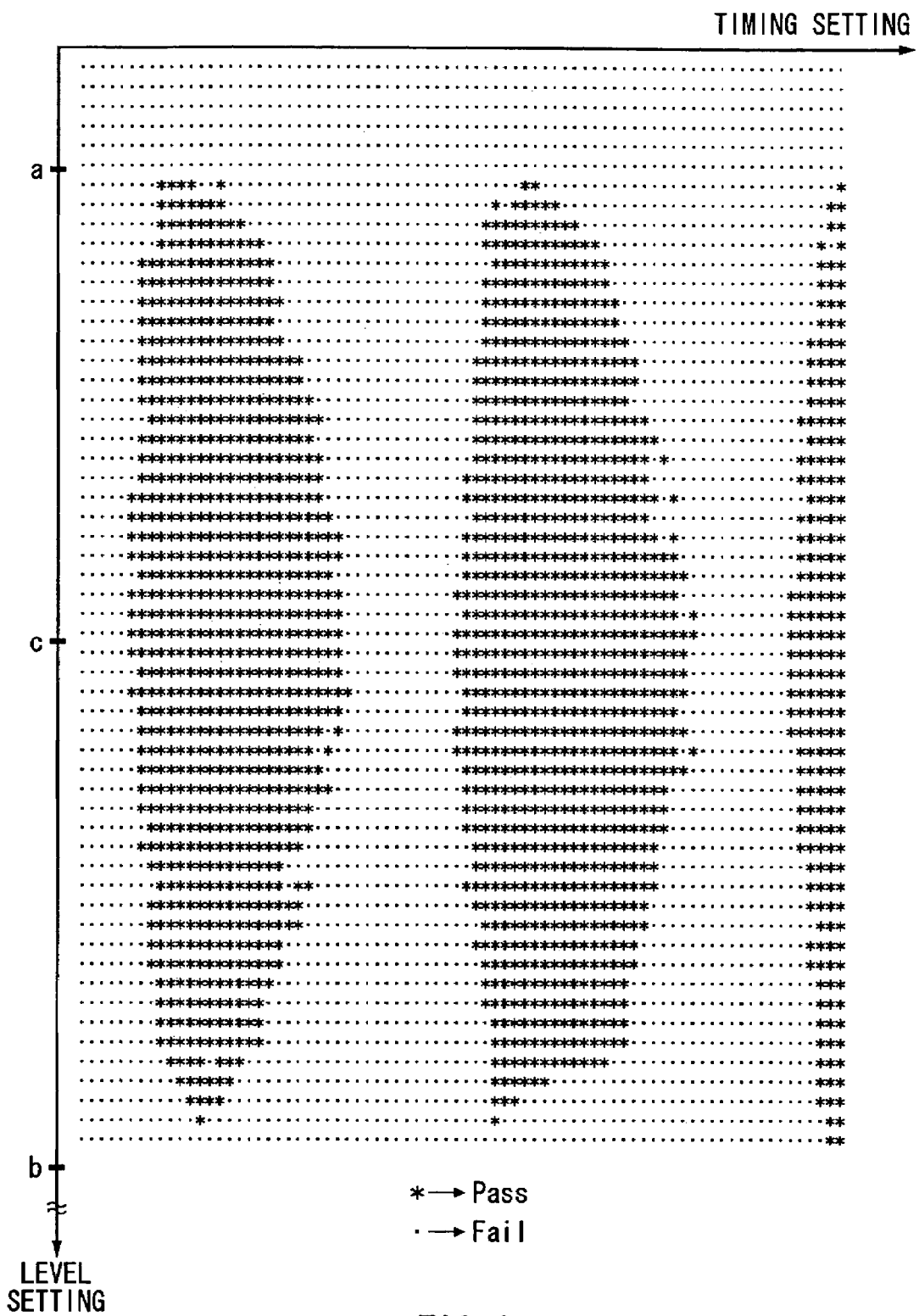
FIG. 4 is a view exemplary showing a comparison result stored on a result storing section 120.

FIG. 4 is a view exemplary showing a comparison result stored on the result storing section 120. As described above, the result storing section 120 stores a comparison result by the comparing section 48 for each the reference level and the latch timing. FIG. 4 is a view exemplary showing a distribution of the comparison results when a horizontal axis is the latch timing and a vertical axis is the reference level.

As shown in FIG. 4, when the latch timing is sequentially changed (a timing setting), an area in which the comparison result is a pass and an area in which the comparison result is a fail appear alternately according to an edge position of the signal input to the receiving circuit 42. Moreover, when the reference level is extremely large or small, the data value output from the level measuring section 34 is constant regardless of a pattern of the sending signal input to the optical transmission section 30. For this reason, since the pattern of the signal input to the comparing section 48 is not identical with the pattern of the expected value, a fail is detected every timing setting.

The transmission system measuring section 110 computes a characteristic of the transfer circuit 100 based on the comparison result. For example, the transmission system measuring section 110 may compute a timing margin of the transfer circuit 100 based on the comparison result. In this case, the transmission system measuring section 110 computes a timing margin based on a width of a timing setting in the case of setting a level in which a width setting timing having a comparison result of a pass is the largest (e.g., a reference level c in FIG. 4). For example, the transmission system measuring section 110 may compute a generally half value of a width of the timing setting as a timing margin of the transfer circuit 100.

Moreover, the measuring apparatus 200 may set the level setting in the measurement controlling section 36 or the level measuring section 34 as a level setting to be used in real use of the transfer circuit 100. In addition, the measuring apparatus 200 may compute the latch timing to be set in real use of the transfer circuit 100 based on the computed timing margin. For example, the measuring apparatus 200 may set a timing setting in the generally middle of a width of the timing setting in the timing controlling section 44 or the receiving circuit 42 as a timing setting to be used in real use of the transfer circuit 100.

By performing such a setting, a setting having a maximum timing margin can be performed in real use of the transfer circuit 100.

In addition, the transmission system measuring section 110 may compute a jitter of the transfer circuit 100 based on the comparison result stored on the comparison result storing section 120. For example, considering a determinate jitter component in the transfer circuit 100, when a certain reference level has been set, when a test period for each timing setting has been changed, that is, even though the time length, for which an expected value signal that the comparing section 48 receives from the expectation generating section 46 and a signal that the comparing section 48 receives from the receiving circuit 42 are compared, has been changed, the comparison result output from the comparing section 48 for each timing setting is not changed.

On the contrary, considering a random jitter component in the transfer circuit 100, when a test period for each timing setting is increased, the detected jitter does not have a high appearance probability, but has a jitter significantly away from a median. For this reason, as a test period is increased, a width of a timing setting showing a comparison result of a pass shown in FIG. 4 becomes small.

That is, the measuring apparatus 200 may compute a determinate jitter component and a random jitter component of the transfer circuit 100 by detecting the comparison results in a plurality of test periods different from one another with respect to each timing setting. The random jitter component in the transfer circuit 100 can be produced based on an amount of change of a width of a timing setting showing a comparison result of a pass in each test period.

Moreover, in the above-described example, the setting controlling section 130 changes a reference level in a range that can be set for the measurement controlling section 36. For example, when the measurement controlling section 36 is a DA converter, the level setting is changed over the whole range of the level capable of being output by the measurement controlling section 36.

However, as described above, all the comparison results are a fail besides a predetermined reference level range (e.g., the level settings a to b in FIG. 4). For this reason, a measurement for all timing settings requires unreasonable measurement time about a range besides the reference level range.

Figure 5:
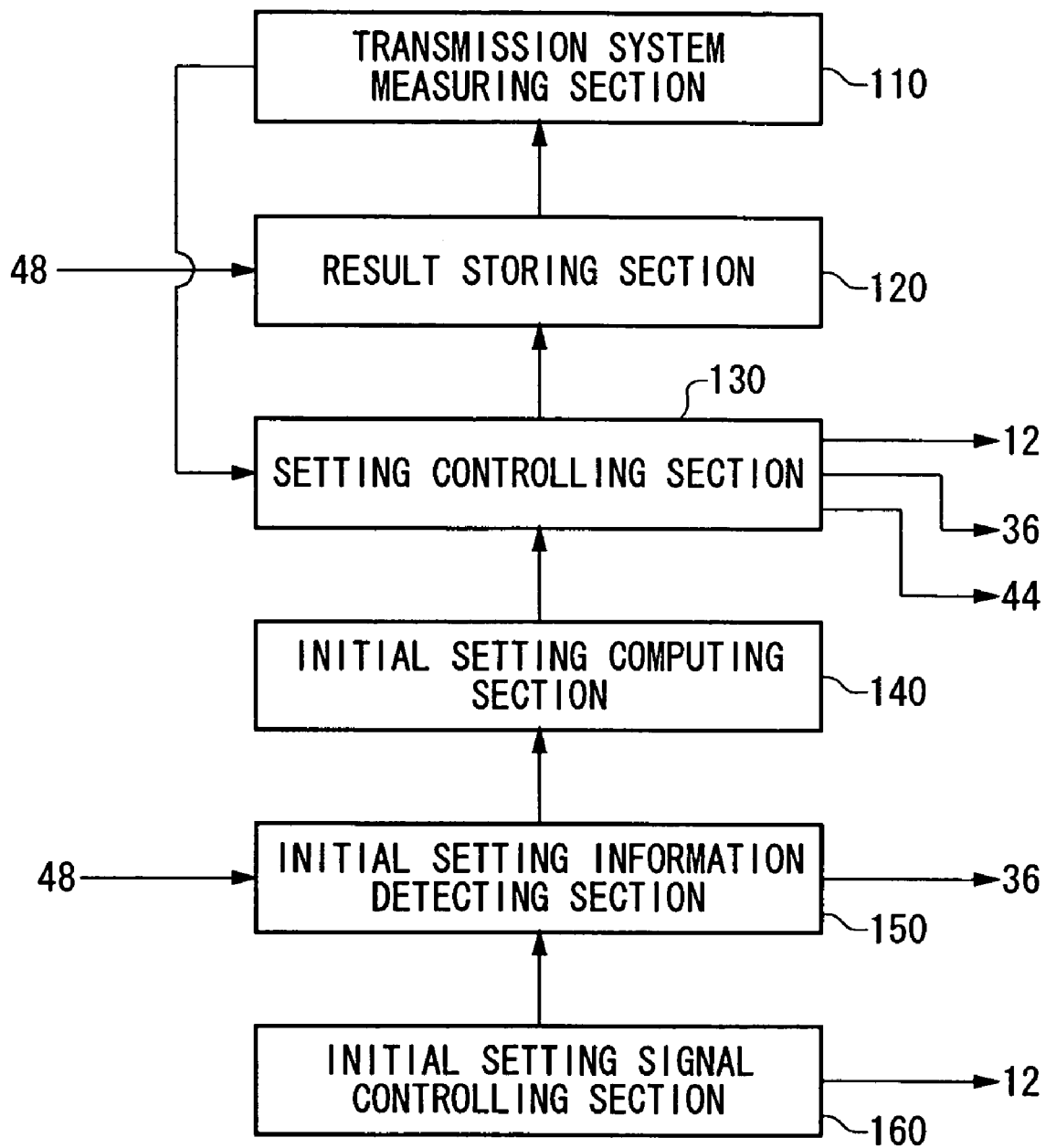
FIG. 5 is a view showing another example of a configuration of the measuring apparatus.

FIG. 5 is a view showing another example of a configuration of the measuring apparatus 200. The measuring apparatus 200 in this example further includes an initial setting computing section 140, an initial setting information detecting section 150, and an initial setting signal controlling section 160 in addition to a configuration of the measuring apparatus shown in FIG. 2. The other components have the functions similar to those of the components having the same reference numerals in FIG. 2.

Figure 6:
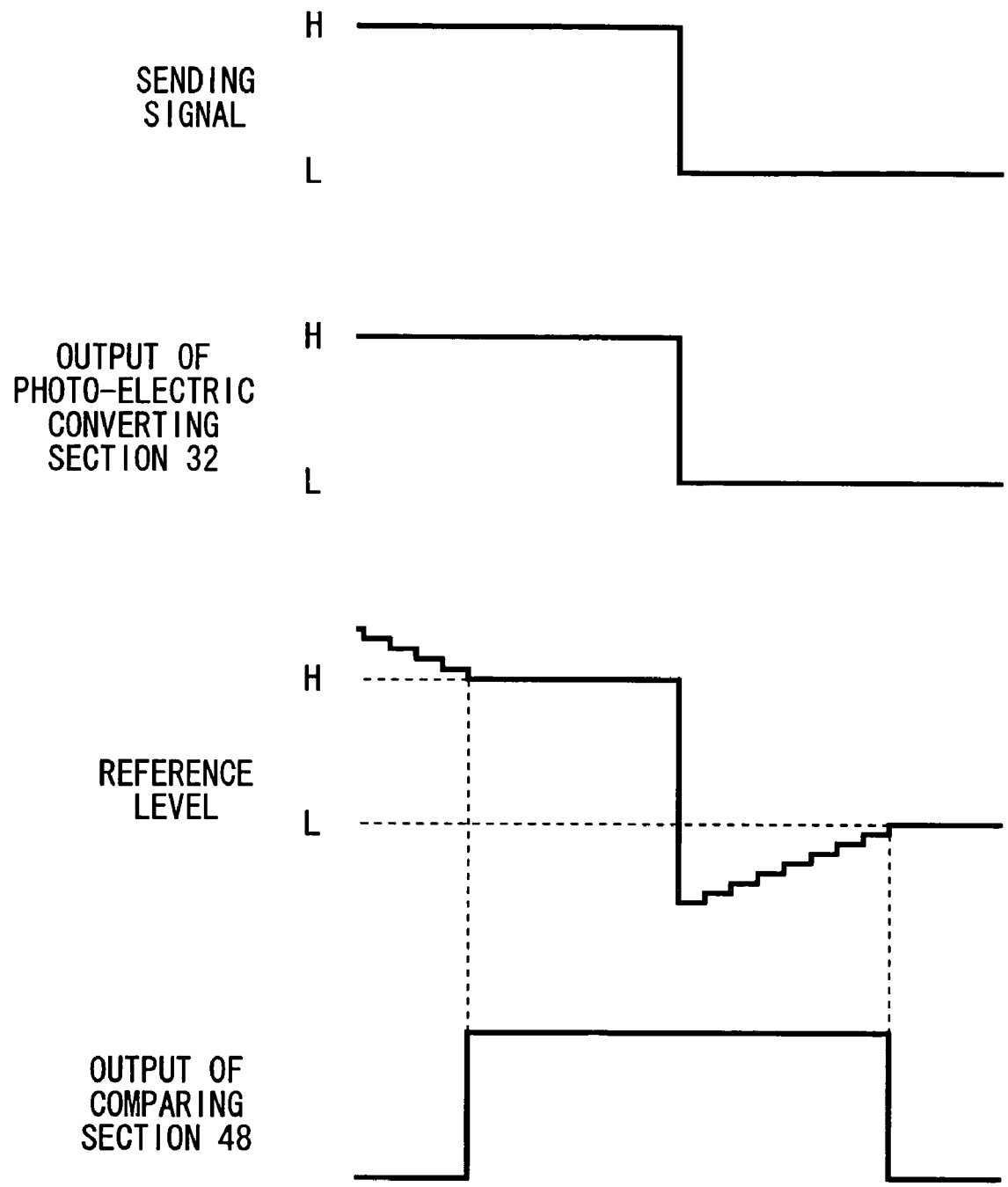
FIG. 6 is a view exemplary showing an operation of the measuring apparatus 200 shown in FIG. 5.

FIG. 6 is a view exemplary showing an operation of the measuring apparatus 200 shown in FIG. 5. The initial setting signal controlling section 160 previously and sequentially sends a sending signal showing H level and a sending signal showing L level to the pattern generating section 12 before measuring the comparison result described in reference to FIG. 4. At this time, a signal wave form output from the photo-electric converting section 32 similarly shows H level and L level in sequence.

Next, when the pattern generating section 12 has sent the sending signals of H level and L level, the initial setting information detecting section 150 sequentially changes a reference level to be supplied to the level measuring section 34. For example, while the sending signal shows H level, the initial setting information detecting section 150 may sequentially set a setting value that gradually decreases by a predetermined value from a maximum level setting value capable of being set in the measurement controlling section 36. Moreover, while the sending signal shows L level, the initial setting information detecting section 150 may sequentially set a setting value that gradually increases by a predetermined value from a minimum level setting value capable of being set in the measurement controlling section 36.

Then, the initial setting information detecting section 150 receives the comparison result by the comparing section 48 every reference level. At this time, the comparing section 48 is supplied with an expected value with the same pattern as the sending signal output from the pattern generating section 12.

The initial setting information detecting section 150 detects a reference level, at which a data value of the electrical signal output from the level measuring section 34 is switched, based on the comparison result. In other words, the initial setting information detecting section 150 detects the reference levels, which are identical with a signal level of an electrical signal when the electrical signal input to the level measuring section 34 shows a logical value H and a signal level of the electrical signal when the electrical signal shows a logical value L, with respect to the logical value H and the logical value L.

Then, the initial setting computing section 140 computes a level variation region of the reference level described above based on each reference level detected by the initial setting information detecting section 150. For example, the initial setting computing section 140 may compute a level variation region when the reference level detected for the logical value L is a lower limit and the reference level detected for the logical value H is an upper bound.

The setting controlling section 130 may perform the processes described in reference to FIG. 3 in the level variation region computed by the initial setting computing section 140. In other words, the reference level may sequentially be changed in the level variation region to obtain the comparison result shown in FIG. 4 for each timing setting.

In this manner, time necessary to obtain the comparison result shown in FIG. 4 can be shortened by previously setting a level variation region.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to measure a detailed characteristic of a transfer circuit including an optical transmission system.

What is claimed is:

1. A method for measuring a characteristic of a transfer circuit which transmits a signal and comprises an electrical signal sending section that transmits a sending signal, a current to light converting section that converts the sending signal to an optical signal, an optical signal transmitting section that transmits the optical signal, a photo-electric converting circuit that converts the optical signal to an electrical signal, a level measuring section that compares the intensity of the electrical signal output from the photo-electric converting circuit and a predetermined reference level to detect a data value of the electrical signal, an electrical signal receiving section that detects a data value of the electrical signal, and a timing controlling section that controls latch timing at which the electrical signal receiving section detects the data value of the electrical signal, the measurement method comprising:

- a comparing step of comparing the data value of the electrical signal received by the electrical signal receiving section with a predetermined expected value;
- a setting controlling step of sequentially changing the reference level and the latch timing with a predetermined resolution; and
- a result storing step of storing a comparison result in said comparing step for each the reference level and the latch timing.

2. A measuring apparatus that measures a characteristic of a transfer circuit transmitting a signal, the transfer circuit comprising:

- an electrical signal sending section that transmits a sending signal;
- a current to light converting section that converts the sending signal into an optical signal;
- an optical signal transmitting section that transmits the optical signal;
- a photo-electric converting circuit that converts the optical signal into an electrical signal;
- a level measuring section that compares the intensity of the electrical signal output from said photo-electric converting circuit and a predetermined reference level to detect a data value of the electrical signal;
- an electrical signal receiving section that detects a data value of the electrical signal; and
- a timing controlling section that controls latch timing at which said electrical signal receiving section detects the data value of the electrical signal, and the measuring apparatus comprising:

- a comparing section that compares the data value of the electrical signal received by said electrical signal receiving section with a predetermined expected value;
- a setting controlling section that sequentially changes the reference level and the latch timing with a predetermined resolution; and
- a result storing section that stores a comparison result by said comparing section for each the reference level and the latch timing.

3. The measuring apparatus as claimed in claim 2, wherein said setting controlling section sequentially changes te latch timing in a predetermined timing variation region whenever the reference level is changed.

4. The measuring apparatus as claimed in claim 2, wherein said setting controlling section sequentially changes the reference level in a predetermined level variation region whenever the latch timing is changed.

5. The measuring apparatus as claimed in claim 3, further comprising a transmission system measuring section that measures a timing margin of the transfer circuit based on the comparison result for each the reference level and the latch timing.

6. The measuring apparatus as claimed in claim 5, wherein said transmission system measuring section computes the latch timing to be set in real use of the transfer circuit based on the timing margin.

7. The measuring apparatus as claimed in claim 4, further comprising:

- an initial setting signal controlling section that sequentially sends the sending signal showing high, H, level and the sending signal showing low, L, level to said electrical signal sending section previously;
- an initial setting information detecting section that sequentially changes the reference level and previously detects the reference level at which the data value of the electrical signal measured by said level measuring section is switched for each of the sending signal of H level and the sending signal of L level when said electrical signal sending section has sent the sending signals of H level and L level; and
- an initial setting computing section that previously computes the level variation region based on each the reference level detected by said initial setting information detecting section.

* * * * *